(12) United States Patent
Liu

(10) Patent No.: US 8,223,312 B2
(45) Date of Patent: Jul. 17, 2012

(54) METHOD OF MANUFACTURING A DISPLAY DEVICE USING A BARRIER LAYER TO FORM AN OHMIC CONTACT LAYER

(75) Inventor: Xiang Liu, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 228 days.

(21) Appl. No.: 12/701,766

(22) Filed: Feb. 8, 2010

(65) Prior Publication Data

US 2010/0208156 A1  Aug. 19, 2010

(30) Foreign Application Priority Data

Feb. 13, 2009  (CN) .......................... 2009 1 0077487

(51) Int. Cl.
*G02F 1/136* (2006.01)
*G02F 1/13* (2006.01)
(52) U.S. Cl. .......................................... 349/187; 349/43
(58) Field of Classification Search ............ 349/43, 349/187
See application file for complete search history.

(56) References Cited

U.S. PATENT DOCUMENTS

| | | | | |
|---|---|---|---|---|
| 5,614,728 A | * | 3/1997 | Akiyama | 257/57 |
| 2006/0139548 A1 | * | 6/2006 | Ahn | 349/141 |
| 2007/0246707 A1 | * | 10/2007 | Deng et al. | 257/57 |
| 2008/0105873 A1 | | 5/2008 | Wang et al. | |

FOREIGN PATENT DOCUMENTS

| | | |
|---|---|---|
| CN | 101005083 A | 7/2007 |
| CN | 101078843 A | 11/2007 |

\* cited by examiner

*Primary Examiner* — Jessica M Merlin
(74) *Attorney, Agent, or Firm* — Ladas & Parry LLP

(57) ABSTRACT

An embodiment of the invention provides a thin film transistor liquid crystal display (TFT-LCD) array substrate comprising: a gate line and a data line that intersect with each other to define a pixel region; and a pixel electrode and a thin film transistor formed in the pixel region. The thin film transistor comprises: a gate electrode connected with the gate line; a semiconductor island positioned above the gate electrode; and a source electrode and a drain electrode that are formed on the semiconductor island. A surface of the semiconductor island contacting with the source electrode and the drain electrode comprises ohmic contact regions subject to a surface treatment and a region of the semiconductor layer between the source electrode and the drain electrode is covered with a barrier layer. Another embodiment of the invention provides a method of manufacturing a thin film transistor liquid crystal display (TFT-LCD) array substrate.

3 Claims, 5 Drawing Sheets

A1 - A1

A2 - A2

A3 - A3

A3 - A3

A3 - A3

A4 - A4

A4 - A4

METHOD OF MANUFACTURING A DISPLAY DEVICE USING A BARRIER LAYER TO FORM AN OHMIC CONTACT LAYER

BACKGROUND

The present invention relates to a thin film transistor liquid crystal display (TFT-LCD) array substrate and a method of manufacturing the same.

Thin film transistor liquid crystal displays (TFT-LCDs) are dominating in the current flat panel display market because they have small volume, low power consumption, non-radiation and so on. For a TFT-LCD, an array substrate and the process of manufacturing the same determine the product performance, yield and price thereof. In order to effectively decrease the price of TFT-LCDs and improve yield, the process of manufacturing a TFT-LCD array substrate is gradually simplified and has been developed from the initial seven mask (7-Mask) process to four mask (4-Mask) process based on the slit photolithography technology.

At present, a TFT-LCD array substrate is manufactured by forming a set of thin film patterns via a set of patterning processes, and each patterning process forms one layer of thin film pattern. The 4-Mask process technology currently used comprises a half-tone mask or a gray-tone mask process, through which patterns for an active layer, a data line, a source electrode, a drain electrode and a TFT channel region are formed in a lump. Because the pattern of a mask is converted to a thin film pattern in each patterning process and each layer of the thin film pattern need to be precisely stacked above another underlying layer of thin film pattern, there are the less the amount of the mask used and the shorter the manufacturing time, the higher productivity and the lower the manufacturing cost are incurred during the process for manufacturing the TFT-LCD array substrate.

SUMMARY

An embodiment of the invention provides a thin film transistor liquid crystal display (TFT-LCD) array substrate comprising: a gate line and a data line that intersect with each other to define a pixel region; and a pixel electrode and a thin film transistor formed in the pixel region. The thin film transistor comprises: a gate electrode connected with the gate line; a semiconductor island positioned above the gate electrode; and a source electrode and a drain electrode that are formed on the semiconductor island. A surface of the semiconductor island contacting with the source electrode and the drain electrode comprises ohmic contact regions subject to a surface treatment and a region of the semiconductor layer between the source electrode and the drain electrode is covered with a barrier layer.

Another embodiment of the invention provides a method of manufacturing a thin film transistor liquid crystal display (TFT-LCD) array substrate comprising: step 1 of depositing a gate metal thin film on a base substrate and forming patterns for a gate line and a gate electrode by a first patterning process; step 2 of sequentially depositing a gate insulating layer, a semiconductor layer and a barrier layer on the resultant substrate after step 1 and then forming a semiconductor pattern and a barrier layer pattern by a second patterning process, wherein the barrier layer pattern is positioned above the semiconductor pattern and a region of the semiconductor pattern other than that covered by the barrier layer pattern is treated to form ohmic contact regions; and step 3 of sequentially depositing a transparent conductive thin film and a source and drain metal thin film on the resultant substrate after step 2 and then forming patterns for a data line, a source electrode, a drain electrode, a thin film transistor (TFT) channel region and a pixel electrode by a third patterning process, wherein the source electrode and the drain electrode are respectively connected with ohmic contact regions of the semiconductor layer via the transparent conductive thin film remaining thereunder, the barrier layer covers the semiconductor layer in the TFT channel region, and the pixel electrode is directly connected with the drain electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Hereinafter, the embodiments of the invention will be further explained as follows in detail with reference to the accompanying drawings.

Figure 1:
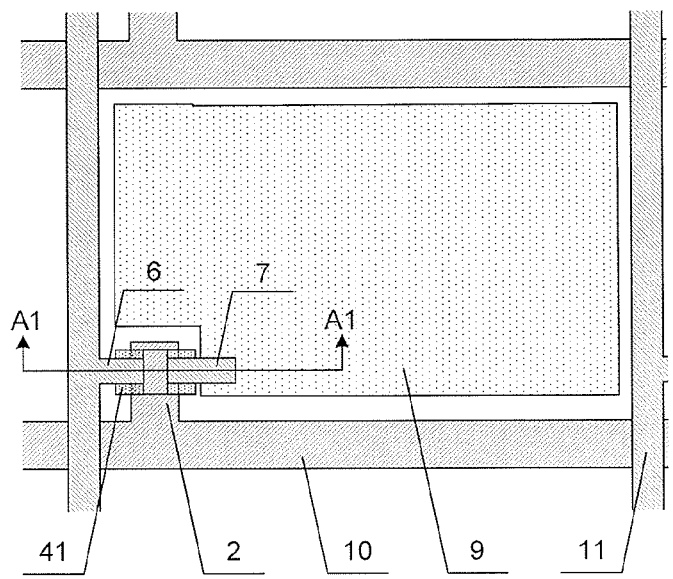
FIG. 1 is a plan view of a TFT-LCD array substrate of an embodiment of the invention.
Figure 2:
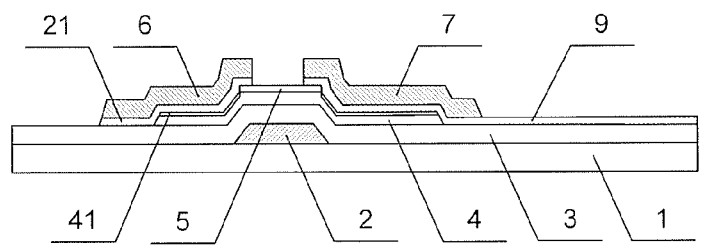
FIG. 2 is a cross-sectional view taken along line A1-A1 of FIG. 1.

FIG. 1 is a plan view of a TFT-LCD array substrate of an embodiment of the invention, and FIG. 2 is a cross-sectional view taken along line A1-A1 of FIG. 1.

As shown in FIGS. 1 and 2, the main structure of the TFT-LCD array substrate of the embodiment comprises a gate line 10, a data line 11, a pixel electrode 9 and a thin film transistor (TFT). The gate line 10 and the data line 11 intersect with each other and define a pixel region, and the thin film transistor and the pixel electrode 9 are formed within the pixel region. The gate line 10 is used to supply a gate signal (e.g., ON signal) to the thin film transistor, and the data line 11 is used to supply a data signal to the pixel electrode 9.

Specifically, the TFT-LCD array substrate of an embodiment of the invention comprises the gate line 10 and a gate electrode 2 formed on a base substrate 1, and the gate electrode 2 is connected with (e.g., formed integratedly) with the gate line 10. A gate insulating layer 3 is formed on the gate electrode 2 and the gate line 10 and covers the entire base substrate 1. A semiconductor island 4 is formed on the gate insulating layer 3 and positioned above the gate electrode 2. The pixel electrode 9 is formed on the gate insulating layer 3 and positioned within the pixel region. One end of the source electrode 6 is formed on the semiconductor island 4, and the other end is connected with the data line 11. The source electrode 6 and the drain electrode 7 are respectively connected with the semiconductor island 4 via the ohmic contact regions 41 formed therebetween. One end of the drain electrode 7 is formed on the semiconductor island 4, and the other end is directly connected with the pixel electrode 9 positioned below the drain electrode 7. A TFT channel region is formed between the source electrode 6 and the drain electrode 7, and a barrier layer 5 for protecting the TFT channel region covers the semiconductor island 4 in the TFT channel region.

In this embodiment of the invention, the surface of the semiconductor island 4 that contacts the source electrode 6 and the drain electrode 7 has ohmic contact regions 41 formed by a surface treatment. The surface treatment is a phosphorizing treatment by using $PH_3$ gas and is performed at a RF power of 5 kW~12 kW, a pressure of 100 mT~400 mT and a gas flux of 1000~4000 sccm. The exposed surface of the semiconductor island is converted into the ohmic contact regions through the phosphorizing treatment, which ensures the electrical connection between the semiconductor island and the source and drain electrodes, and therefore, a doped semiconductor layer commonly formed in a conventional process cannot be used and at the same time the process for depositing the doped semiconductor layer can also be omitted. Therefore, expenses used for the manufacturing apparatus can be decreased, the manufacturing material is saved, the cost is reduced, the manufacturing time is shortened and productivity is improved.

FIGS. 3 through 19 are schematic views showing the process of manufacturing the TFT-LCD array substrate of the embodiment of the invention. In the following description, "patterning process" mentioned in the embodiment of the invention generally comprises coating a photoresist film, masking, exposing and developing the photoresist film to form a photoresist pattern, etching with the photoresist pattern, stripping off the remaining photoresist pattern, etc. An example of photoresist is positive photoresist.

Figure 3:
FIG. 3 is a plan view of the TFT-LCD array substrate of the embodiment of the invention after a first patterning process.
Figure 3:
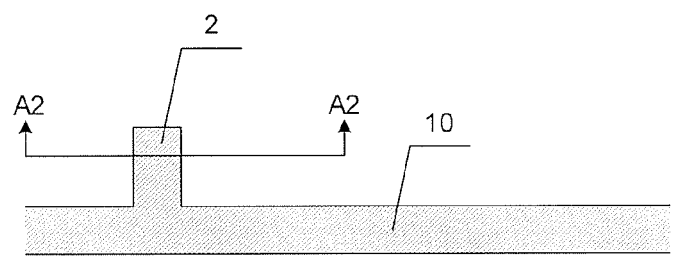
Figure 4:
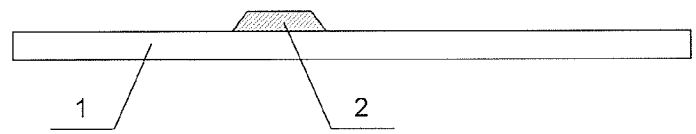
FIG. 4 is a cross-sectional view taken along line A2-A2 of FIG. 3.

FIG. 3 is a plan view of the TFT-LCD array substrate of the embodiment of the invention after a first patterning process, and FIG. 4 is a cross-sectional view taken along line A2-A2 of FIG. 3. Firstly, a gate metal thin film having a thickness of 500 Å~4000 Å is deposited on a base substrate 1 (such as a glass substrate or a quartz substrate) by using a magnetron sputtering process, a thermal evaporation process or other film forming method. The gate metal thin film may be a single thin film of a metal such as Cr, W, Ti, Ta, Mo, Al, Cu and the like or an alloy thereof, or a multilayer thin film comprising any combination of the above metals. As shown in FIGS. 3 and 4, the gate metal thin film is patterned by the first patterning process using a common mask, and a gate line 10 and a gate electrode 2 are formed on the base substrate. A common electrode line that is parallel to the gate line 10 may be further formed during this patterning process.

Figure 5:
FIG. 5 is a plan view of the TFT-LCD array substrate of the embodiment of the invention after a second patterning process.
Figure 5:
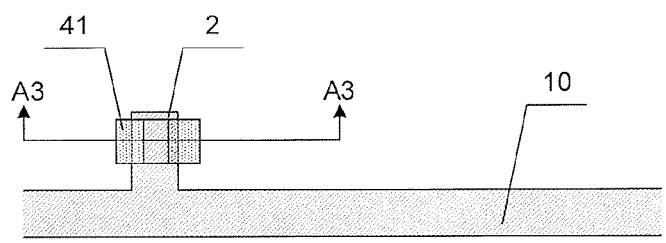
Figure 6:
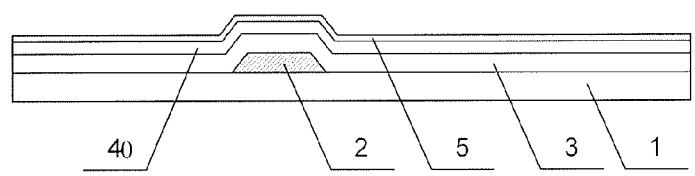
FIG. 6 is a cross-sectional view of the TFT-LCD array substrate of the embodiment of the invention taken along line A3-A3 after depositing thin films during the second patterning process.

FIG. 5 is a plan view of the TFT-LCD array substrate of the embodiment of the invention after a second patterning process, and FIG. 6 is a cross-sectional view of the TFT-LCD array substrate of the embodiment of the invention taken along line A3-A3 after depositing thin films during the second patterning process. Firstly, on the base substrate 1, a gate insulating layer 3 having a thickness of 300 Å~1000 Å, a semiconductor layer 40 having a thickness of 1000 Å~3000 Å and a barrier layer 5 having a thickness of 1000 Å~3000 Å are sequentially deposited by using a plasma enhanced chemical vapor deposition (PECVD) process or other film forming method. Oxide, nitride or oxynitride layer can be used for the gate insulating layer 3 and the barrier layer 5, and corresponding reaction gases for the gate insulating layer 3 and the barrier layer 5 may be a mixture gas of $SiH_4$, $NH_3$ and $N_2$ or a mixture gas of $SiH_2Cl_2$, $NH_3$ and $N_2$, and a reaction gas corresponding to the semiconductor layer may be a mixture gas of $SiH_4$ and $H_2$ or a mixture gas of $SiH_2Cl_2$ and $H_2$.

Figure 7:
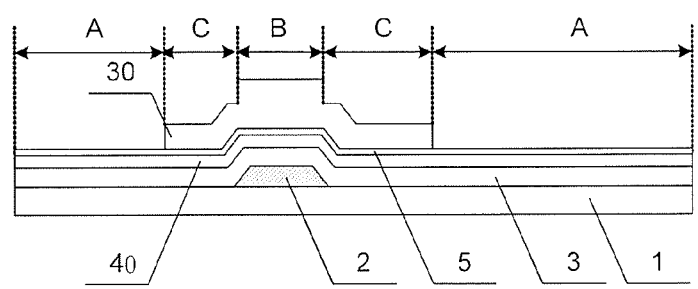
FIG. 7 is a cross-sectional view of the TFT-LCD array substrate of the embodiment of the invention taken along line A3-A3 after exposing and developing a photoresist film during the second time patterning process.

FIG. 7 is a cross-sectional view of the TFT-LCD array substrate of the embodiment of the invention taken along line A3-A3 after exposing and developing a photoresist film during the second patterning process. A photoresist film 30 is coated on the barrier layer 5, the photoresist film 30 is exposed by using a half-tone mask or a gray-tone mask to convert the photoresist form 30 into a photoresist pattern having a completely exposed region A, a non-exposed region B and a half-exposed region C. The non-exposed region B corresponds to the region where a barrier layer pattern is positioned, the half-exposed region C corresponds to the region where a semiconductor pattern is positioned, and the completely exposed region A correspond to the region other than the above regions. After the developing process, the thickness of the photoresist film in the non-exposed region B is not substantially changed, and therefore a photoresist completely remaining region is formed; the photoresist film in the completely exposed region A is removed, and therefore a photoresist removed region is formed; the thickness of the photoresist film in the half-exposed region C becomes thinner, and a photoresist half-remaining region is formed, as shown in FIG. 7.

Figure 8:
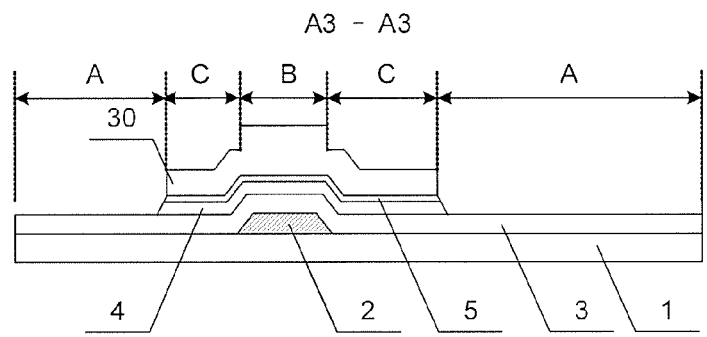
FIG. 8 is a cross-sectional view of the TFT-LCD array substrate of the embodiment of the invention taken along line A3-A3 after a first etching process during the second patterning process.

FIG. 8 is a cross-sectional view of the TFT-LCD array substrate of the embodiment of the invention taken along line A3-A3 after a first etching process during the second patterning process. By the first etching process, the barrier layer 5 and the semiconductor layer 40 in the completely exposed region A are removed, the gate insulating layer 3 in this region is exposed, and a semiconductor pattern (a semiconductor island) 4 is formed, as shown in FIG. 8.

Figure 9:
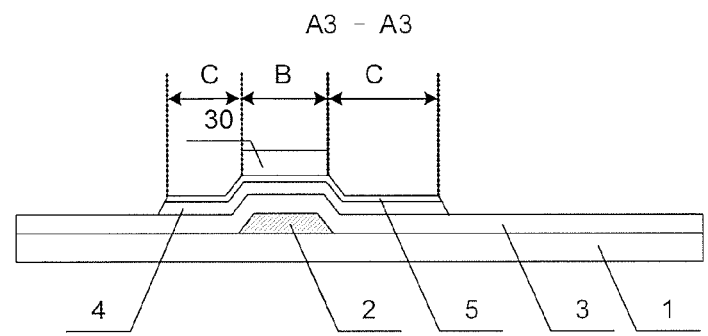
FIG. 9 is a cross-sectional view of the TFT-LCD array substrate of the embodiment of the invention taken along line A3-A3 after an ashing process during the second patterning process.

FIG. 9 is a cross-sectional view of the TFT-LCD array substrate of the embodiment of the invention taken along line A3-A3 after an ashing process during the second patterning process. By the ashing process, the thickness of the photoresist film 30 is reduced, the photoresist film 30 in the half-exposed region C is removed, and the barrier layer 5 in this region is exposed, as shown in FIG. 9. Since the thickness of the photoresist film 30 in the non-exposed region B is larger than that of the photoresist film in the half-exposed region C, a portion of the photoresist film 30 having a thickness still remains in the non-exposed region B after this ashing process.

Figure 10:
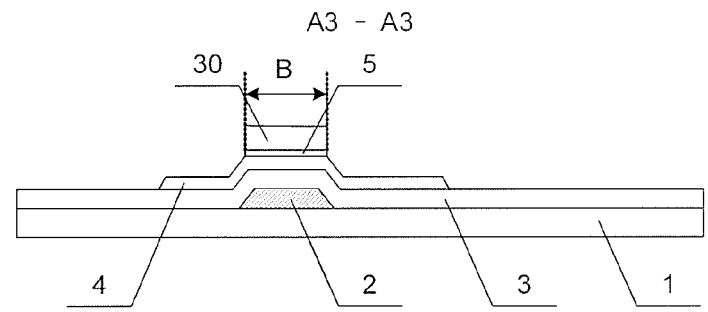
FIG. 10 is a cross-sectional view of the TFT-LCD array substrate of the embodiment of the invention taken along line A3-A3 after a second etching during the second patterning process.

FIG. 10 is a cross-sectional view of the TFT-LCD array substrate of the embodiment of the invention taken along line A3-A3 after a second etching during the second patterning process. By etching the barrier layer 5 in the half-exposed region C through the second etching process, the barrier layer 5 in this region is removed, the semiconductor island 4 is exposed and a barrier layer pattern is formed, as shown in FIG. 10.

Figure 11:
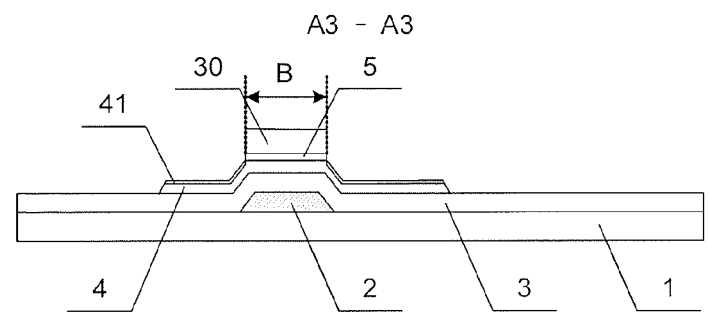
FIG. 11 is a cross-sectional view of the TFT-LCD array substrate of the embodiment of the invention taken along line A3-A3 after a surface treatment during the second patterning process.

FIG. 11 is a cross-sectional view of the TFT-LCD array substrate of the embodiment of the invention taken along line A3-A3 after a surface treatment during the second patterning process. As shown in FIG. 11, through surface treating the exposed semiconductor island 4, the exposed surface of the semiconductor island 4 is converted into ohmic contact regions 41. The surface treatment of an embodiment of the invention is a phosphorizing treatment by using $PH_3$ gas and is performed at a RF power of 5 kW~12 kW, a pressure of 100 mT~400 mT, and a gas flux of 1000~4000 sccm.

Figure 12:
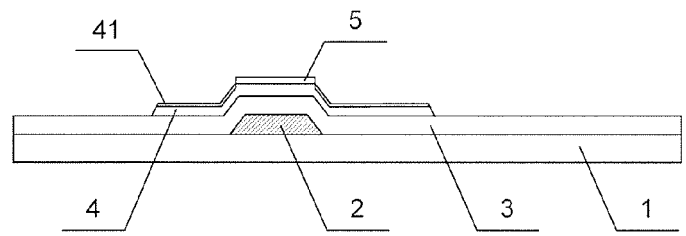
FIG. 12 is a cross-sectional view of the TFT-LCD array substrate of the embodiment of the invention taken along line A3-A3 after the second patterning process.

FIG. 12 is a cross-sectional view of the TFT-LCD array substrate of the embodiment of the invention taken along line A3-A3 after the second patterning process. Finally, the remaining photoresist film 30 is stripped off, completing the second patterning process of the TFT-LCD array substrate of the embodiment of the invention, as shown in FIGS. 5 and 12. After the second patterning process of the embodiment of the invention, the semiconductor pattern is formed above the gate electrode 2, and the barrier layer pattern is formed above the semiconductor pattern and covers a TFT channel region only.

Figure 13:
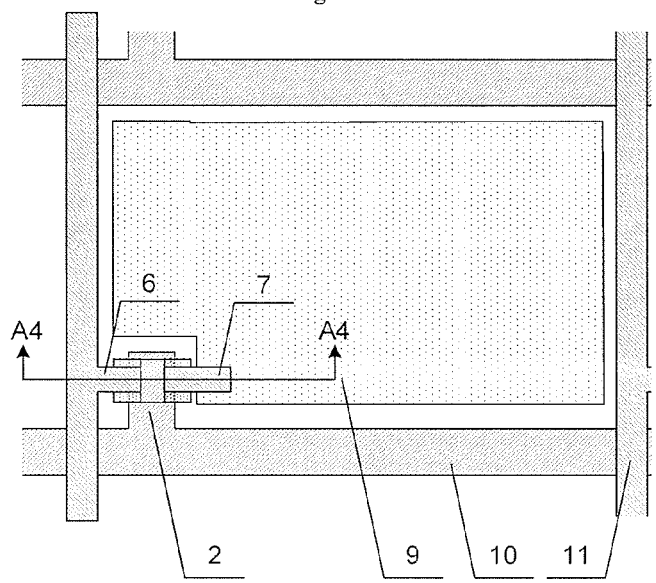
FIG. 13 is a plan view of the TFT-LCD array substrate of the embodiment of the invention after a third patterning process.
Figure 14:
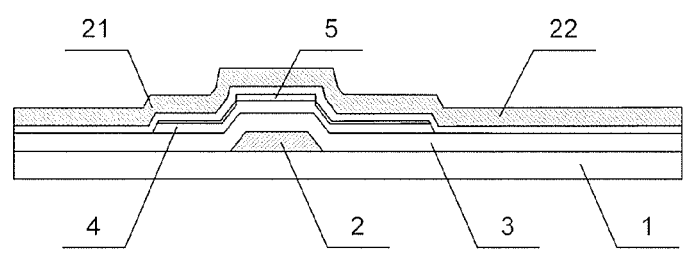
FIG. 14 is a cross-sectional view of the TFT-LCD array substrate of the embodiment of the invention taken along line A4-A4 after depositing thin films during the third patterning process.

FIG. 13 is a plan view of the TFT-LCD array substrate of the embodiment of the invention after the third patterning process, and FIG. 14 is a cross-sectional view of the TFT-LCD array substrate of the embodiment of the invention taken along line A4-A4 after depositing thin films during the third patterning process. On the base substrate 1, a transparent conductive thin film 21 having a thickness of 300 Å~600 Å and a source and drain metal thin film 22 having a thickness of 4000 Å~10000 Å are sequentially deposited by using a magnetron sputtering process, a thermal evaporation process or other film forming method. The transparent conductive thin film 21 may use a material such as indium tin oxide (ITO), indium zinc oxide (IZO) or aluminum zinc oxide and the like. The source and drain metal thin film 22 may be a single thin film of a metal such as Cr, W, Ti, Ta, Mo, Al, Cu and the like or an alloy thereof, or a multilayer thin film comprising any combination of the above metals, as shown in FIG. 14.

Figure 15:
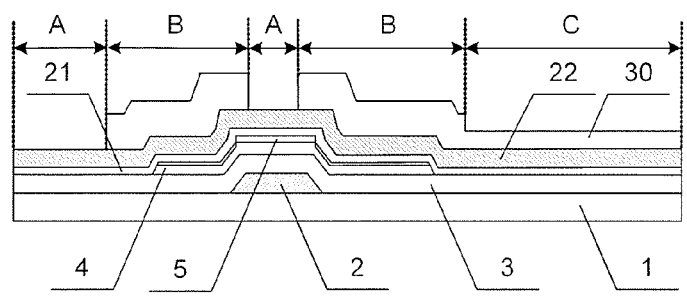
FIG. 15 is a cross-sectional view of the TFT-LCD array substrate of the embodiment of the invention taken along line A4-A4 after exposing and developing a photoresist film during the third patterning process.

FIG. 15 is a cross-sectional view of the TFT-LCD array substrate of the embodiment of the invention taken along line A4-A4 after exposing and developing a photoresist film during the third patterning process. A photoresist film (e.g., a positive photoresist film) 301 is coated on the source and drain metal thin film 22, the photoresist film 301 is exposed by using a half-tone mask or a gray-tone mask to convert the photoresist film 301 into a completely exposed region A, a non-exposed region B and a half-exposed region C. The non-exposed region B corresponds to the region where patterns for a data line, a source electrode and a drain electrode are positioned, the half-exposed region C corresponds to the region where a pixel electrode pattern is positioned, and the completely exposed region A corresponds to a region other than the regions corresponding to the above patterns. After developing process, the thickness of the photoresist film 301 in the non-exposed region B is not substantially changed, and a photoresist completely remaining region is formed; the photoresist film 301 in the completely exposed region B is removed, and a photoresist removed region is formed; the thickness of the photoresist film 301 in the half-exposed region C becomes thinner, and a photoresist half-remaining region is formed, as shown in FIG. 15.

Figure 16:
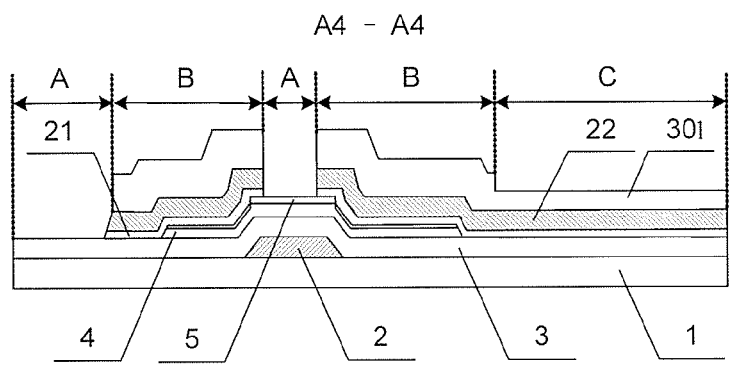
FIG. 16 is a cross-sectional view of the TFT-LCD array substrate of the embodiment of the invention taken along line A4-A4 after a first etching process during the third patterning process.

FIG. 16 is a cross-sectional view of the TFT-LCD array substrate of the embodiment of the invention taken along line A4-A4 after a first etching process during the third patterning process. By removing the source and drain metal thin film 22 and the transparent conductive thin film 21 in the completely exposed region A through the first etching process, the data line, the source electrode and the drain electrode are formed. The TFT channel region is formed between the source electrode and the drain electrode and the surface of the semiconductor island 4 in the TFT channel region is covered with the barrier layer 5, as shown in FIG. 16.

Figure 17:
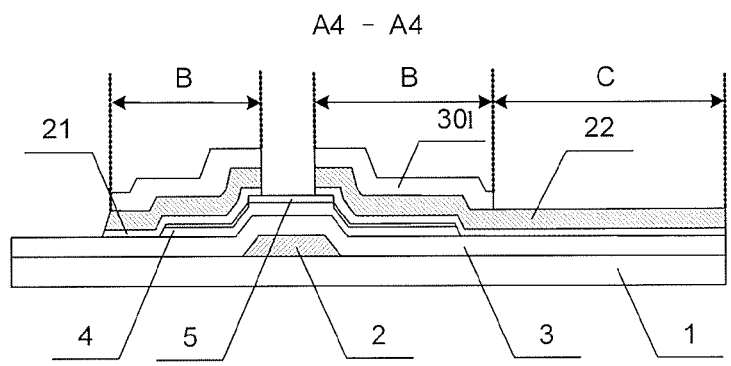
FIG. 17 is a cross-sectional view of the TFT-LCD array substrate of the embodiment of the invention taken along line A4-A4 after an ashing process during the third patterning process.

FIG. 17 is a cross-sectional view of the TFT-LCD array substrate of the embodiment of the invention taken along line A4-A4 after an ashing process during the third patterning process. By the ashing process, the thickness of the photoresist film 301 is reduced, the photoresist film 301 in the half-exposed region C is removed, and the source and drain metal thin film 22 in this region is exposed, as shown in FIG. 17. Since the thickness of the photoresist film 301 in the non-exposed region B is larger than that of the photoresist film 301 in the half-exposed region C, a portion of photoresist film 301 still remain in the non-exposed region B after this process.

Figure 18:
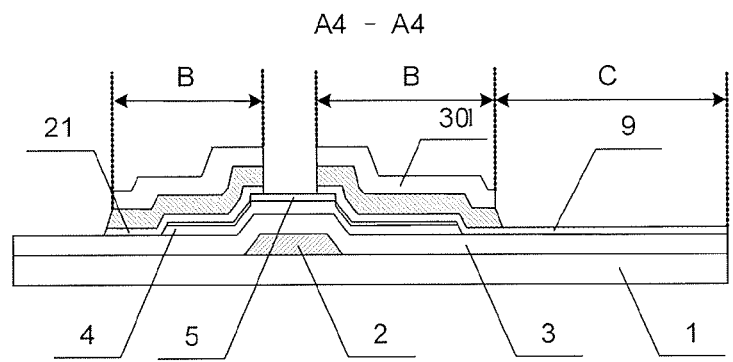
FIG. 18 is a cross-sectional view of the TFT-LCD array substrate of the embodiment of the invention taken along line A4-A4 after a second etching process during the third patterning process.

FIG. 18 is a cross-sectional view of the TFT-LCD array substrate of the embodiment of the invention taken along line A4-A4 after a second etching during the third patterning process. By etching the source and drain metal thin film 22 in the half-exposed region C by the second etching process, the source and drain metal thin film 22 in this region is removed, the underlying transparent conductive thin film 21 is exposed and a pixel electrode 9 is formed, as shown in FIG. 18.

Figure 19:
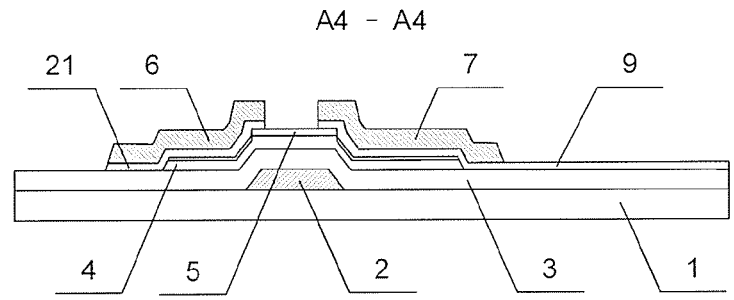
FIG. 19 is a cross-sectional view of the TFT-LCD array substrate of the embodiment of the invention taken along line A4-A4 after the third patterning process.

FIG. 19 is a cross-sectional view of the TFT-LCD array substrate of the embodiment of the invention taken along line A4-A4 after the third patterning process. Finally, the remaining photoresist film is stripped off, completing the third patterning process of the TFT-LCD array substrate of the embodiment of the invention, as shown in FIGS. 13 and 19. After the third patterning process of the embodiment of the invention, the source electrode 6 contacts with one ohmic contact region 41 formed on the semiconductor island 4 via the transparent conductive thin film 21. One end of the source electrode 6 is positioned on the barrier layer 5 and the other end is connected with the data line 11. The drain electrode 7 contacts with another ohmic contact region 41 formed on the semiconductor island 4 via the transparent conductive thin film 21. One end of the drain electrode 7 is positioned on the barrier layer 5 and the other end is directly connected to the pixel electrode 9 formed within the pixel region through the transparent conductive thin film 21. A TFT channel region is formed between the source electrode 6 and the drain electrode 7 and the semiconductor island 4 in the TFT channel region is covered with the barrier layer 5.

An embodiment of the invention provides a TFT-LCD array substrate. The TFT-LCD array substrate can be produced by the following steps: firstly, patterns for a gate line and a gate electrode are formed by a first patterning process; then, a semiconductor pattern is formed by a second patterning process using a half-tone mask or a gray-tone mask, and the exposed surface of the semiconductor pattern is treated to form ohmic contact regions; finally, patterns for a data line, a source electrode, a drain electrode, a TFT channel region and a pixel electrode pattern are formed by the third patterning process using a half-tone mask or a gray-tone mask. According to the embodiment of the invention, the TFT-LCD array substrate is manufactured not only by three patterning processes (three masks) but also by forming ohmic contact regions by surface treating the semiconductor layer. Neither a doped semiconductor layer nor a process for depositing the doped semiconductor layer is used. Therefore, according to the embodiment of the invention, expense used for the manufacturing apparatus is decreased, the manufacturing material is saved, the cost is reduced, the manufacturing time is shortened, and productivity is improved. In addition, the pixel electrode of an embodiment of the invention is directly connected with the drain electrode, and therefore the electrical contact therebetween is improved, yield is increased, and the application prospect is wide.

A method of manufacturing the TFT-LCD array substrate of an embodiment of the invention may comprise the following steps.

Step 1. A gate metal thin film is deposited on a base substrate, and the patterns for a gate line and a gate electrode are formed by a first patterning process.

Step 2. A gate insulating layer, a semiconductor layer and a barrier layer are sequentially deposited on the resultant substrate after the step 1, a semiconductor pattern and a barrier layer pattern are formed by a second patterning process. The barrier layer pattern is positioned above the semiconductor pattern, and a region of the semiconductor layer other than that covered by the barrier layer pattern is treated to form ohmic contact regions.

Step 3. A transparent conductive thin film and a source and drain metal thin film are sequentially deposited on the resultant substrate after the step 2, and the patterns for a data line, a source electrode, a drain electrode, a TFT channel region and a pixel electrode are formed by a third patterning process. The source electrode and the drain electrode are respectively connected with ohmic contact regions of the semiconductor layer via the transparent conductive thin film remaining thereunder, the barrier layer covers the semiconductor layer in the TFT channel region, and the pixel electrode is directly connected with the drain electrode.

An example of the step 2 of the method according to the embodiment of the invention may comprise the following steps.

Step 2-1. A gate insulating layer, a semiconductor layer and a barrier layer are sequentially deposited on the resultant substrate after step 1.

Step 2-2. A photoresist film is coated on the barrier layer.

Step 2-3. The photoresist film is exposed by using a half-tone mask or a gray-tone mask to convert the photoresist film into a photoresist removed region, a photoresist completely remaining region and a photoresist half-remaining region. The photoresist completely remaining region corresponds to the region where a barrier layer pattern is positioned, the photoresist half-remaining region corresponds to the region where the semiconductor pattern is positioned, and the photoresist removed region corresponds to the region other than the regions corresponding to the above patterns. After a developing process, the thickness of the photoresist film in the photoresist complete remaining region is not substantially changed, the photoresist film in the photoresist removed region is removed, and the thickness of the photoresist in the photoresist half-remaining region becomes thinner.

Step 2-4. By a first etching process, the barrier layer and the semiconductor layer in the photoresist removed region are removed, the gate insulating layer in this region is exposed, and the semiconductor pattern is formed.

Step 2-5. By an ashing process, the photoresist film in the photoresist half-remaining region is removed, and the barrier layer in this region is exposed.

Step 2-6. By a second etching process, the barrier layer in the photoresist half-remaining region is removed, the semiconductor layer is exposed, and the barrier layer pattern is formed.

Step 2-7: A region of the semiconductor layer other than that covered by the barrier layer pattern is treated to convert the exposed surface of the semiconductor layer into ohmic contact regions.

Step 2-8. The remaining photoresist film is stripped off.

The above example shows a process in which the semiconductor pattern and the barrier layer pattern are simultaneously formed in one patterning process by several etching process and a surface treatment is performed. The surface treatment is phosphorizing treatment by using $PH_3$ gas. Further, the phosphorizing treatment according to the embodiment of the invention is performed at a RF power of 5 kW~12 kW, a pressure of 100 mT~400 mT and a gas flux of 1000~4000 sccm.

An example of the step 3 of the method according to the embodiment of the invention may comprise the following steps.

Step 3-1. A transparent conductive thin film and a source and drain metal thin film are sequentially deposited on the resultant substrate after step 2.

Step 3-2. A photoresist film is coated on the source and drain metal thin film.

Step 3-3. The photoresist film is exposed by using a half-tone mask or a gray-tone mask to convert the photoresist film into a photoresist removed region, a photoresist completely remaining region and a photoresist half-remaining region. The photoresist completely remaining region corresponds to the region where patterns for a data line, a source electrode and a drain electrode are positioned, the photoresist half-remaining region corresponds to the region where a pixel electrode pattern is positioned, and the photoresist removed region corresponds to the region other than the regions corresponding to the above patterns. After a developing process, the thickness of the photoresist film in the photoresist completely remaining region is not substantially changed, the photoresist film in the photoresist removed region is removed, and the thickness of the photoresist film in the photoresist half-remaining region becomes thinner.

Step 3-4. By a first etching process, the transparent conductive thin film and the source and drain metal thin film in the photoresist removed region are removed, the data line, the source electrode, the drain electrode and the TFT channel region pattern are formed. The source electrode and the drain electrode are respectively connected with the ohmic contact regions of the semiconductor layer via the transparent conductive thin film, and the barrier layer covers the semiconductor layer in the TFT channel region.

Step 3-5. By an ashing process, the photoresist film in the photoresist half-remaining region is removed, and the source and drain metal thin film in this region is exposed.

Step 3-6. The source and drain metal thin film in the photoresist half-remaining region is removed by a second etching process, and the pixel electrode pattern is formed and the pixel electrode is directly connected with the drain electrode.

Step 3-7. The remaining photoresist film is stripped.

The above example shows a process in which patterns for a data line, a source electrode and a drain electrode and a TFT channel region and a pixel electrode pattern are simultaneously formed in one patterning process by several etching process.

In step 1 of the method of the embodiment, a gate metal thin film having a thickness of 500 Å~4000 Å is deposited on the base substrate 1 (such as a glass substrate or a quartz substrate) by using the magnetron sputtering, the thermal evaporation or other film forming method. The gate metal thin film may be a single thin film of a metal such as Cr, W, Ti, Ta, Mo, Al, Cu and the like or an alloy thereof, or a multilayer thin film comprising any combination of the above metals. The gate metal thin film can be patterned by a patterning process using common mask, and the gate line and the gate electrode are formed on the substrate. A common electrode line pattern parallel to the gate line may be formed during this patterning process.

The embodiment of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A method of manufacturing a thin film transistor liquid crystal display (TFT-LCD) array substrate comprising:
    step 1 of depositing a gate metal thin film on a base substrate and forming patterns for a gate line and a gate electrode by a first patterning process;
    step 2 of sequentially depositing a gate insulating layer, a semiconductor layer and a barrier layer on the resultant substrate after step 1 and then forming a semiconductor pattern and a barrier layer pattern by a second patterning process, wherein the barrier layer pattern is positioned above the semiconductor pattern and a region of the semiconductor pattern other than that covered by the barrier layer pattern is treated to form ohmic contact regions, step 2 further including:
        step 2-1 of coating a photoresist film on the barrier layer after the gate insulating layer, the semiconductor layer and the barrier layer are sequentially deposited on the resultant substrate after step 1;
        step 2-2 of exposing the photoresist film by using a half-tone mask or a gray-tone mask to convert the photoresist film into a photoresist removed region, a photoresist completely remaining region and a photoresist half-remaining region, wherein the photoresist completely remaining region corresponds to a region where the barrier layer pattern to be formed is positioned, the photoresist half-remaining region corresponds to a region where the semiconductor pattern to be formed is positioned, and the photoresist removed region corresponds to a region without the barrier layer pattern and the semiconductor pattern; after a developing process, a thickness of the photoresist film in the photoresist complete remaining region is not changed, the photoresist film in the photoresist removed region is removed, and a thickness of the photoresist film in the photoresist half-remaining region becomes thinner;
        step 2-3 of removing the barrier layer and the semiconductor layer in the photoresist removed region by a first etching process, so that the gate insulating layer in the photoresist removed region is exposed and the semiconductor pattern is formed;
        step 2-4 of removing the photoresist film in the photoresist half-remaining region by an ashing process, so that the barrier layer in the photoresist half-remaining region is exposed;
        step 2-5 of removing the barrier layer in the photoresist half-remaining region by a second etching process, so that the semiconductor layer is exposed and the barrier layer pattern is formed;
        step 2-6 of treating the region of the semiconductor pattern other than that covered by the barrier layer pattern to convert the exposed surface of the semiconductor layer into ohmic contact regions; and
        step 2-7 of stripping of the remaining photoresist film; and
    step 3 of sequentially depositing a transparent conductive thin film and a source and drain metal thin film on the resultant substrate after step 2 and then forming patterns for a data line, a source electrode, a drain electrode, a thin film transistor (TFT) channel region and a pixel electrode by a third patterning process, wherein the source electrode and the drain electrode are respectively connected with ohmic contact regions of the semiconductor layer via the transparent conductive thin film remaining thereunder, the barrier layer covers the semiconductor layer in the TFT channel region, and the pixel electrode is directly connected with the drain electrode.

2. The method of claim 1, wherein the surface treatment is a phosphorizing treatment by using $PH_3$ gas, and is performed at a RF power of 5 kW~12 kW, a pressure of 100 mT~400 mT and a gas flux of 1000~4000 sccm.

3. The method of claim 1, wherein the step 3 comprises:
    step 3-1 of coating a photoresist film on the source and drain metal thin film, after the transparent conductive thin film and the source and drain metal thin film are sequentially deposited on the resultant substrate after step 2;
    Step 3-2 of exposing the photoresist film by using a half-tone mask or a gray-tone mask to convert the photoresist into a photoresist removed region, a photoresist completely remaining region and a photoresist half-remaining region, wherein the photoresist completely remaining region corresponds to a region where the patterns for the data line, the source electrode and the drain electrode are positioned, the photoresist half-remaining region corresponds to a region where the pixel electrode pattern to be formed is positioned, and the photoresist removed region corresponds to a region without the patterns; after a developing process, a thickness of the photoresist film in the photoresist completely remaining region is not changed, the photoresist film in the photoresist removed region is removed and a thickness of the photoresist film in the photoresist half-remaining region becomes thinner;

Step 3-3 of removing the transparent conductive thin film and the source and drain metal thin film in the photoresist removed region by a first etching process, so that the data line, the source electrode and the drain electrode and the TFT channel region pattern are formed;

step 3-4 of removing the photoresist film in the photoresist half-remaining region, so that the source and drain metal thin film in this region is exposed;

step 3-5 of removing the source and drain metal thin film in the photoresist half-remaining region by a second etching process, so that the pixel electrode pattern is formed;

step 3-6 of stripping off the remaining photoresist film.

* * * * *